United States Patent
Ko et al.

(10) Patent No.: US 10,679,858 B2
(45) Date of Patent: Jun. 9, 2020

(54) DEPOSITION APPARATUS AND DEPOSITION METHOD

(71) Applicant: Samsung Display Co., Ltd., Yongin-si, Gyeonggi-do (KR)

(72) Inventors: Dong Kyun Ko, Hwaseong-si (KR); Woo Jin Kim, Hwaseong-si (KR); Myung Soo Huh, Suwon-si (KR); In Kyo Kim, Seongnam-si (KR); Keun Hee Park, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/163,629

(22) Filed: Oct. 18, 2018

(65) Prior Publication Data

US 2019/0326122 A1     Oct. 24, 2019

(30) Foreign Application Priority Data

Apr. 23, 2018  (KR) .......................... 10-2018-0046716

(51) Int. Cl.

| | |
|---|---|
| *H01L 21/28* | (2006.01) |
| *C23C 16/448* | (2006.01) |
| *C23C 16/452* | (2006.01) |
| *C23C 16/455* | (2006.01) |
| *H01L 29/51* | (2006.01) |

(52) U.S. Cl.
CPC .... *H01L 21/28185* (2013.01); *C23C 16/4488* (2013.01); *C23C 16/452* (2013.01); *C23C 16/455* (2013.01); *H01L 21/28194* (2013.01); *H01L 21/28202* (2013.01); *H01L 29/518* (2013.01)

(58) Field of Classification Search
CPC ............ H01L 21/28185; H01L 29/518; H01L 21/28202; H01L 21/28194; C23C 16/455; C23C 16/452; C23C 16/4488
USPC .......................................................... 438/775
See application file for complete search history.

(56) References Cited

U.S. PATENT DOCUMENTS

| | | | |
|---|---|---|---|
| 6,960,537 B2 | 11/2005 | Shero et al. | |
| 7,438,949 B2 * | 10/2008 | Weidman ................ | C23C 16/06 427/250 |
| 9,583,336 B1 * | 2/2017 | Srinivasan ........ | H01L 21/02197 |
| 2005/0252449 A1 | 11/2005 | Nguyen et al. | |
| 2006/0086319 A1 * | 4/2006 | Kasai ...................... | C23C 16/16 118/715 |

(Continued)

*Primary Examiner* — Vu A Vu
(74) *Attorney, Agent, or Firm* — Kile Park Reed & Houtteman PLLC

(57) ABSTRACT

A deposition apparatus includes a chamber, a susceptor that supports a substrate in the chamber, an upper electrode facing the susceptor, a showerhead defining a gas inlet space between the upper electrode and the susceptor, a metal source storage to store a metal source supplied to the chamber, a vaporizer to vaporize the metal source, a first gas source to supply a first gas to move the metal source toward the vaporizer, a second gas source to supply a second gas to move the metal source in the vaporizer toward the chamber, a third gas source connected to the chamber to supply a third gas into a reaction space defined between the susceptor and the upper electrode such that the third gas reacts with the metal source, and a fourth gas source connected to the chamber to supply a fourth gas used to clean an inside of the chamber.

20 Claims, 9 Drawing Sheets

(56) References Cited

U.S. PATENT DOCUMENTS

| | | | |
|---|---|---|---|
| 2006/0115590 A1* | 6/2006 | Suzuki | C23C 16/16 427/248.1 |
| 2006/0130757 A1* | 6/2006 | Li | C23C 16/16 118/715 |
| 2006/0228898 A1 | 10/2006 | Wajda et al. | |
| 2013/0224381 A1 | 8/2013 | Masuda et al. | |

\* cited by examiner

DEPOSITION APPARATUS AND DEPOSITION METHOD

Korean Patent Application No. 10-2018-0046716 filed on Apr. 23, 2018 in the Korean Intellectual Property Office, and entitled: "Deposition Apparatus and Deposition Method," is incorporated by reference herein in its entirety.

BACKGROUND

1. Field

Embodiments relate to a deposition apparatus and a deposition method.

2. Description of the Related Art

Display devices become more and more important as multimedia technology evolves. Accordingly, a variety of types of display devices such as liquid-crystal display (LCD) devices and organic light-emitting display (OLED) devices are currently used.

Among display devices, an LCD device is one of the most broadly used flat panel display devices. An LCD device is composed of two substrates on which electrodes for generating electric field such as pixel electrodes and common electrodes are formed, and a liquid-crystal layer interposed between the two substrates. Voltage is applied to the electrodes for electric field to form electric field in the liquid-crystal layer, such that the orientation of the liquid crystals contained in the liquid-crystal layer is aligned and the polarization of incident light is controlled, to display images.

Among these, an organic light-emitting display device displays images by using organic light-emitting diodes (OLEDs) that utilize the phenomenon that holes and electrons recombine to generate light. Such an organic light-emitting display device has advantages in that it has fast response speed, high luminance and large viewing angle, and low power consumption.

Methods for fabricating such display devices commonly include the chemical vapor deposition (CVD).

SUMMARY

Embodiments are directed to a deposition apparatus including a chamber, a susceptor that supports a substrate in the chamber, an upper electrode facing the susceptor, a showerhead defining a gas inlet space between the upper electrode and the susceptor, a metal source storage to store a metal source supplied to the chamber, a vaporizer to vaporize the metal source, a first gas source connected to the metal source storage to supply a first gas to move the metal source toward the vaporizer, a second gas source connected to the vaporizer to supply a second gas to move the metal source in the vaporizer toward the chamber, a third gas source connected to the chamber to supply a third gas into a reaction space defined between the susceptor and the upper electrode such that the third gas reacts with the metal source, and a fourth gas source connected to the chamber to supply a fourth gas used to clean an inside of the chamber.

The fourth gas may include one selected from boron trichloride ($BCl_3$), chlorine molecule ($Cl_2$), and nitrogen trifluoride ($NF_3$).

The apparatus may further include a power supplier to supply a radio frequency (RF) power to the upper electrode. A plasma region may be formed in the reaction space when the RF power is supplied to the upper electrode.

The third gas may be nitrous oxide ($N_2O$) or oxygen ($O_2$). The third gas may generate oxygen anions in the plasma region.

The metal source and the reaction gas may react with each other to form a metal oxide layer in the chamber.

The metal oxide layer may be in an amorphous state. The metal oxide layer may have a dielectric constant ranging from 10 to 50.

The fourth gas may remove a part of the metal oxide layer formed on an inner wall of the chamber or the showerhead.

The metal source may include at least one metal precursor selected from a zirconium (Zr) precursor, a hafnium (HF) precursor, and a titanium (Ti) precursor.

The metal precursor may be selected from $Zr(N(CH_3)_2(C_2H_5))_3$, $Zr(N(CH_3)C_2H_5)_4$, $Zr(OC(CH_3)_3)_4$, $Ti(N(CH_3)_2(C_2H_5))$, $Hf(N(CH_3)_3(C_2H_5))_3$, $Hf(N(CH_3)C_2H_5)_4$ and $Hf(OC(CH_3)_3)_4$.

The first gas and the second gas may include helium or argon.

The metal source may be supplied into the reaction space via the gas inlet space.

The third gas may be supplied into the reaction space without passing through the gas inlet space.

The third gas may be supplied into the reaction space via the gas inlet space.

The apparatus may further include a plasma chamber outside the chamber. The plasma chamber may be configured to transform the third gas or the fourth gas into a plasma state.

The third gas or the fourth gas may be supplied into the reaction space of the chamber via the plasma chamber.

Embodiments are also directed to a deposition apparatus including a chamber, a susceptor in the chamber and the susceptor being configured to support a substrate, an upper electrode facing the susceptor, a showerhead defining a gas inlet space between the upper electrode and the susceptor, a bubbler that stores a metal source supplied into the chamber, a first gas source connected to the bubbler to supply a first gas used to transform the metal source into bubbles, a reaction gas source connected to the chamber to supply a reaction gas into the reaction space defined between the susceptor and the upper electrode so that the reaction gas reacts with the metal source, and a cleaning gas source connected to the chamber to supply a cleaning gas used to clean an inside of the chamber.

The cleaning gas may include one selected from the group consisting of boron trichloride ($BCl_3$), chlorine molecule ($Cl_2$), and nitrogen trifluoride ($NF_3$).

The third gas may be nitrous oxide ($N_2O$) or oxygen ($O_2$).

The metal source may include at least one metal precursor selected from zirconium (Zr) precursor, hafnium (HF) precursor, and titanium (Ti) precursor.

Embodiments are also directed to a deposition method including supplying a vaporized metal source or a metal source in the form of bubbles into a chamber, supplying a reaction gas into the chamber, transforming the reaction gas into a plasma state, supplying a cleaning gas into the chamber, and transforming the cleaning gas into a plasma state. The reaction gas in the plasma state may react with the metal source to form a metal oxide layer. The cleaning gas in the plasma state may remove the metal oxide layer.

The fourth gas may be supplied into the reaction space via the gas inlet space.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
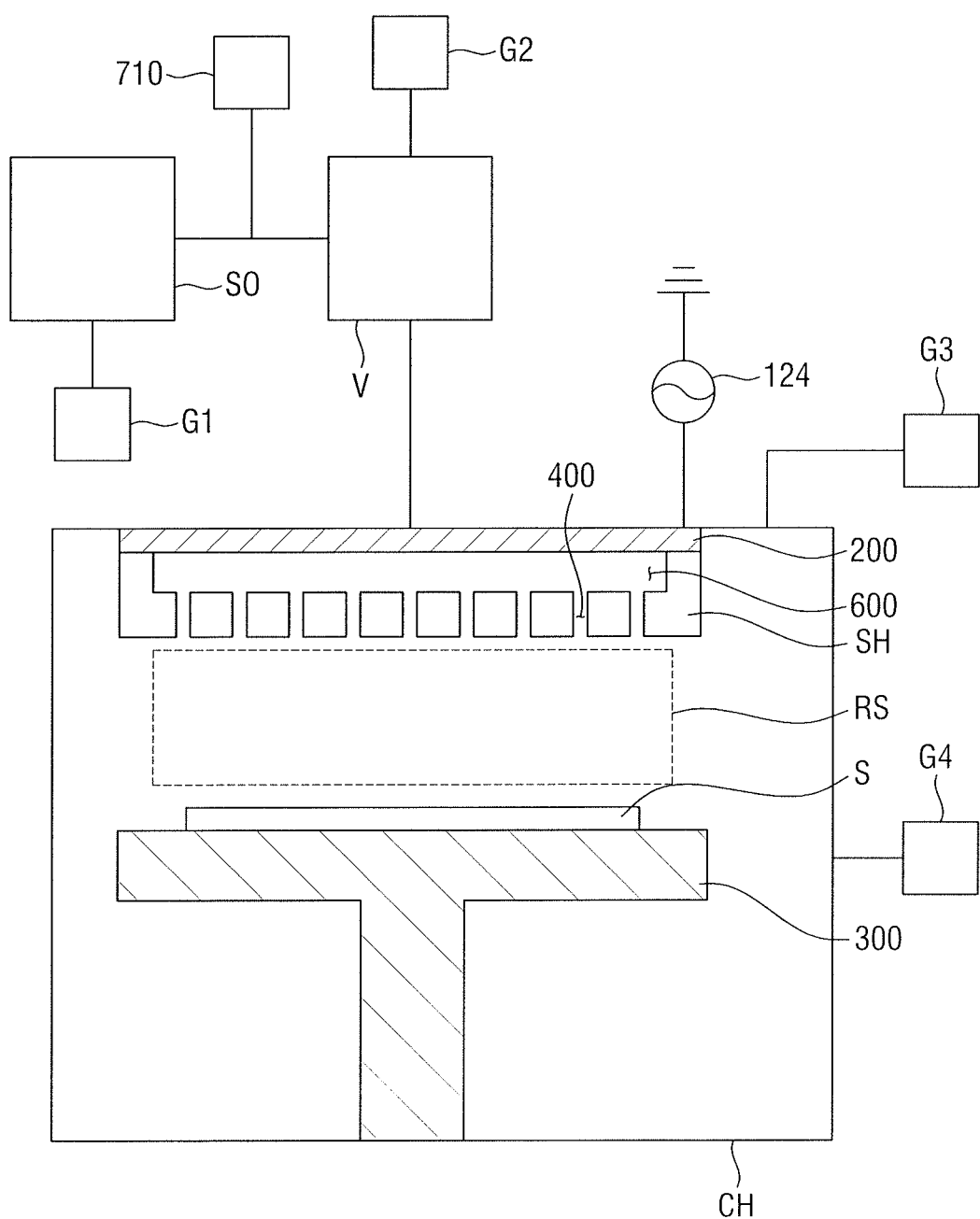
FIG. 1 illustrates a view showing a deposition apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a view showing a deposition apparatus according to an exemplary embodiment.

Referring to FIG. 1, a deposition apparatus according to an exemplary embodiment includes a chamber CH, a susceptor 300, an upper electrode 200, a showerhead SH, a metal source storage SO, a vaporizer V, a first gas source G1, a second gas source G2, a third gas source G3, and a fourth gas source G4.

The chamber CH may define the internal space for a desired process. A number of elements to be described below may be disposed in the internal space of the chamber CH. The chamber CH may be maintained at atmospheric pressure or under vacuum depending on process steps. The internal space of the chamber CH may be connected to the outside air or closed depending on the process steps.

The susceptor 300 may be disposed at a lower portion of the internal space of the chamber CH. The susceptor 300 may support a substrate S to be processed.

The substrate S may be an insulating substrate used in a display device.

According to an exemplary embodiment, the susceptor 300 may be connected to a driving mechanism for moving the substrate S up and down. The substrate S mounted on the susceptor 300 may be moved up or down in the internal space of the chamber CH as desired.

The susceptor 300 may be connected to a temperature adjuster for changing the temperature of the substrate S. The temperature can be adjusted according to the process conditions.

The susceptor 300 may function as a lower electrode facing the upper electrode 200 to be described below.

The upper electrode 200 may be disposed to face the susceptor 300. The upper electrode 200 may be spaced apart from the susceptor 300.

A reaction space RS may be defined between the upper electrode 200 and the susceptor 300. The reaction space RS may be defined as the space where different kinds of gases, described below, react.

According to an exemplary embodiment, the deposition apparatus may further include a power supplier 124. The power supplier 124 may apply radio frequency (RF) power to the upper electrode 200. When the power supplier 124 applies radio frequency (RF) power to the upper electrode 200, an electric field may be formed between the upper electrode 200 and the susceptor 300. The electric field formed between the upper electrode 200 and the susceptor 300 may transform different kinds of gases, described below, into a plasma state. For convenience of illustration and explanation, a region where the gases are transformed into a plasma state is referred to as a plasma region. According to an exemplary embodiment, the plasma region may be formed in the reaction space RS.

When RF power is applied to the upper electrode 200, a plasma region may be formed between the susceptor 300 and the upper electrode 200. The gases described below may be excited into a plasma state in the plasma region.

The showerhead SH may be disposed between the upper electrode 200 and the susceptor 300.

The showerhead SH may define a gas inlet space 600. The gas inlet space 600 may be defined by the showerhead SH and the upper electrode 200.

The showerhead SH may made of a suitable material. For example, the showerhead SH may include aluminum or an aluminum alloy. In some implementations, the showerhead SH may include stainless steel (SUS).

The showerhead SH may include a plurality of shower holes 400 opened toward the reaction space RS.

The shower holes 400 may connect the gas inlet space 600 with the reaction space RS. For example, when the gas inlet space 600 is filled with a gas, the gas may be supplied to the reaction space RS through the shower holes 400. The gas in the gas inlet space 600 may be supplied to the reaction space RS through the shower holes 400 at a uniform flux.

The metal source storage SO may be connected to the chamber CH. The metal source storage SO may provide a metal source into the chamber CH.

The metal source may include a metal precursor. The metal precursor may include at least one selected from among zirconium (Zr) precursor, hafnium (HF) precursor, and titanium (Ti) precursor.

For example, the metal precursor may include at least one selected from $Zr(N(CH_3)_2(C_2H_5))_3$, $Zr(N(CH_3)C_2H_5)_4$, $Zr(OC(CH_3)_3)_4$, $Ti(N(CH_3)_2(C_2H_5))$, $Hf(N(CH_3)_3(C_2H_5))_3$, $Hf(N(CH_3)C_2H_5))_4$ and $Hf(OC(CH_3)_3)_4$.

The metal source storage SO may store a metal source in a liquid phase. The metal source storage SO may include the vaporizer V to vaporize the metal source in the liquid phase. The metal source storage SO may be connected to the vaporizer V by at least one channel.

The metal source storage SO may be connected to the first gas source G1. The first gas source G1 may be connected to the metal source storage SO by at least one channel.

The first gas source G1 may provide the first gas to the metal source storage SO.

The first gas may push up the liquid metal source to transfer it to the vaporizer V. The first gas may be an inert gas. The inert gas may be or include, for example, helium (He) or argon (Ar).

The metal source moved by the first gas may be vaporized in the vaporizer V. The vaporizer V may vaporize the metal source at a high temperature.

The second gas source G2 may be connected to the vaporizer V to provide a second gas to the vaporizer V.

The second gas may be used to spray the liquid metal source provided in the vaporizer V to dissolve the metal source into smaller particles, thereby facilitating the vaporization of the metal source particles.

The second gas may push the vaporized metal source into the chamber. For example, the vaporized metal source may be pushed by the second gas into the chamber CH. The second gas may include helium (He) or argon (Ar) gas.

The vaporizer V may be connected to the showerhead SH of the chamber CH. For example, the metal source vaporized in the vaporizer V may be supplied into the gas inlet space 600 of the showerhead SH.

The metal source provided in the gas inlet space 600 may be provided into the reaction space RS through the plurality of shower holes 400.

For example, the metal source entering the gas inlet space 600 may be evenly distributed inside the reaction space RS via the shower holes 400.

The chamber CH may be connected to the third gas source G3. The third gas source G3 may be connected to the chamber CH to provide a third gas to the reaction space RS. The third gas may react with the metal precursor as the reaction gas.

The chamber CH may be connected to the third gas source G3 via at least one channel. The third gas source G3 may be provided into the reaction space RS without going through the showerhead SH.

For example, the metal source and the third gas may enter into the reaction space RS via different routes and meet each other in the reaction space RS. When the metal source and the third gas enter the reaction space RS via different routes, it may be possible to prevent the metal source and the third gas from reacting with each other before reaching the reaction space, which could result in a defective deposition, or which could lower the reaction efficiency in the reaction space RS.

The third gas may be nitrous oxide ($N_2O$) and/or oxygen ($O_2$). When RF power is applied to the upper electrode 200 such that a plasma region is formed in the reaction space RS, the nitrous oxide ($N_2O$) and/or oxygen ($O_2$) can provide oxygen anions.

The oxygen anions may be used to oxidize the metal source. For example, the metal source and the third gas may react with each other to form a layer on the surface of the substrate S. When the metal precursor contained in the metal source one of a zirconium (Zr) precursor, a hafnium (HF) precursor and a titanium (Ti) precursor, the product of the reaction between the metal source and the third gas may be a metal oxide layer. For example, the metal oxide layer may include at least one selected from zirconium oxide ($ZrO_2$) layer, hafnium oxide ($HfO_2$) layer, and titanium oxide ($TiO_2$) layer.

When broken bond charge of the oxygen anions is discontinuous, the metal oxide layer grown by the above-described process may have an amorphous state, and the metal oxide layer as the resulting product of the reaction may have a high dielectric constant (high-k). For example, the dielectric constant (k) of the metal oxide layer may range from 10 to 50.

The fourth gas source G4 may be connected to the chamber CH via at least one channel.

The fourth gas source G4 may provide a fourth gas to the chamber CH4. The fourth gas may be a cleaning gas for cleaning the inside of the chamber CH.

For example, a metal oxide layer may be formed in the reaction space by the reaction between the metal source and the third gas, and the metal oxide layer may be adsorbed onto the substrate S. A portion of the generated metal oxide layer may be adsorbed onto the inner wall of the chamber CH or onto the showerhead SH. Such metal oxide layer adsorbed on the inner wall of the chamber CH or the showerhead SH could adversely affect the reaction environment, such that the reaction efficiency could be lowered. In addition, if a portion of the metal oxide layer were to be formed in the shower holes 400, at least some of the shower holes 400 are blocked, thereby affecting the flux of the shower holes 400, which could lead to a decrease in deposition uniformity.

The fourth gas may serve to remove a portion of the metal oxide layer that is formed inadvertently on the inner wall of the chamber CH. Hereinafter, such a part of the metal oxide layer is referred to as a "residual layer" to distinguish it from the metal oxide layer normally formed on the substrate S. The residual layer may be removed by etching the residual layer with the fourth gas. The fourth gas may be at least one of boron trichloride ($BCl_3$), chlorine molecule ($Cl_2$), and nitrogen trifluoride ($NF_3$).

The fourth gas may be in a plasma state in the plasma region in the chamber CH. When the fourth gas is boron trichloride ($BCl_3$) and chlorine molecule ($Cl_2$), chlorine anions or chlorine radicals in the plasma state may be provided. When the fourth gas is nitrogen trifluoride ($NF_3$), fluorine anions or fluorine radicals may be provided.

The generated chlorine anions or chlorine radicals may react with the residual layer, which is a metal oxide layer. For example, if the residual layer is made up of zirconium oxide (ZrOx), the residual layer may react with chlorine anions or chlorine radicals to result in gaseous zirconium chloride (ZrCl) and oxygen. Zirconium chloride (ZrCl) and oxygen are both gases. Accordingly, the residual layer adsorbed on the inner wall of the chamber CH may be entirely vaporized and removed. Similarly, if the residual layer is made up of hafnium oxide (HfOx), the residual layer may react with chlorine anions or chlorine radicals to result in gaseous hafnium chloride (HFCl) and oxygen.

If the residual layer is made up of titanium oxide (TiOx), the residual layer may react with chlorine anions or chlorine radicals to result in gaseous titanium chloride (TiCl) and oxygen.

Similarly, when the fourth gas generates fluorine anions or fluorine radicals, the generated fluorine anions or fluorine radicals may react with the metal oxide layer. The products of the reaction between the residual layer and the fluorine anions or the fluorine radicals, such as ZrF, HfF and TiF, are all gaseous. Accordingly, the residual layer can be vaporized and removed.

As described above, by removing the residual layer inside the chamber CH with the fourth gas, it may be possible to skip an operation of stopping the facility to remove the residual layer and an operation of cleaning the inside of the chamber CH in the facility. In this manner, the break time of the process can be reduced and the process efficiency can be improved.

According to an exemplary embodiment, the deposition apparatus may further include a fifth gas source 710 connected to a channel connecting the metal source storage SO with the vaporizer V. The fifth gas source 710 may supply a fifth gas to remove the metal source that may remain between the metal source storage SO and the vaporizer V.

The metal source storage SO and/or the vaporizer V may be expendable parts that are discardable and replaceable with new parts. The fifth gas source may be used to remove any metal source remaining in the channel connecting the metal source storage SO with the vaporizer V at the time of replacing the metal source storage SO and/or the vaporizer V.

The fifth gas may be an octane gas. In some implementations, the fifth gas source 710 may be omitted.

Hereinafter, a deposition apparatus according to another exemplary embodiment will be described. Some of elements described below may be identical to those of the deposition apparatus according to the above-described exemplary embodiment; and, therefore, to avoid redundancy, description thereof will not be repeated.

Figure 2:
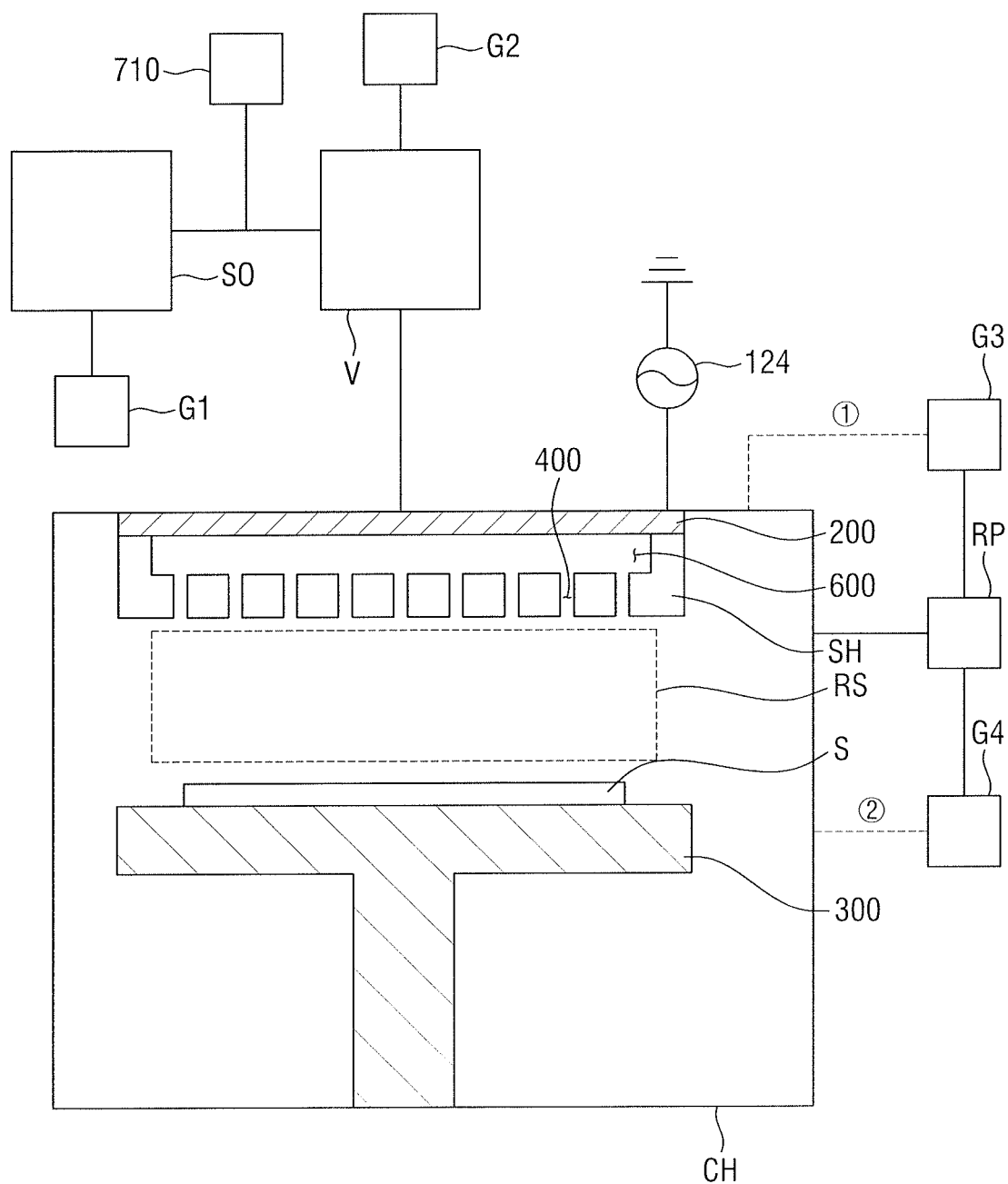
FIG. 2 illustrates a view showing a deposition apparatus according to an exemplary embodiment.

FIG. 2 illustrates a view showing a deposition apparatus according to an embodiment.

According to the embodiment illustrated in FIG. 2, a deposition apparatus may further include a plasma chamber RP.

The plasma chamber RP may define a separate internal space that is distinct from the space of the chamber CH. The plasma chamber RP may form a plasma region therein.

To form the plasma region, the plasma chamber RP may include electrodes facing each other, and a power supply for supplying RF power to one of the electrodes.

The plasma chamber RP may be connected to the chamber CH by at least one channel.

The third gas source G3 and/or the fourth gas source G4 may be connected to the plasma chamber RP.

For example, the third gas source G3 and the fourth gas source G4 may be connected to the plasma chamber RP.

The third gas source G3 and the fourth gas source G4 may each be connected to the plasma chamber RP via at least one channel, respectively, When the third gas source G3 and the fourth gas source G4 are connected to the plasma chamber RP, the third gas and the fourth gas may be supplied to the plasma chamber RP.

When a plasma region is formed in the plasma chamber RP with the third gas and the fourth gas being supplied into the plasma chamber RP, the third gas and the fourth gas may be in a plasma state. As described above, the third gas may be used to generate oxygen anions, and the fourth gas may be used to generate at least one of chlorine anions, chlorine radicals, fluorine anions, and fluorine radicals.

In addition, the resulting products in the plasma chamber RP (at least one of the above-mentioned oxygen anions, chlorine anions, chlorine radicals, fluorine anions and fluorine radicals) may be provided into the chamber CH, for example, into the reaction space of the chamber CH.

In some implementations, the third gas source may be directly connected to the chamber CH as indicated by dotted line ① in FIG. 2. The fourth gas source may be connected to the chamber CH via the plasma chamber RP. The third gas may be transformed into a plasma state in the reaction space RS of the chamber CH. The fourth gas may be supplied into the reaction space RS of the chamber CH after it has been transformed into a plasma state in the plasma chamber RP.

In some implementations, the third gas source G3 may be connected to the chamber CH via the plasma chamber RP, and the fourth gas source G4 may be connected directly to the chamber CH as indicated by dotted line ② of FIG. 2. The third gas may be supplied into the reaction space RS of the chamber CH after it has been transformed into the plasma state in the plasma chamber RP. The fourth gas may be transformed into the plasma state in the reaction space RS of the chamber CH.

As such, by supplying the third gas and/or the fourth gas into the chamber CH after they have been transformed into the plasma state in a separate space using the plasma chamber RP, the materials required for the reaction can be provided in the appropriate states, thereby improving the reaction efficiency.

Figure 3:
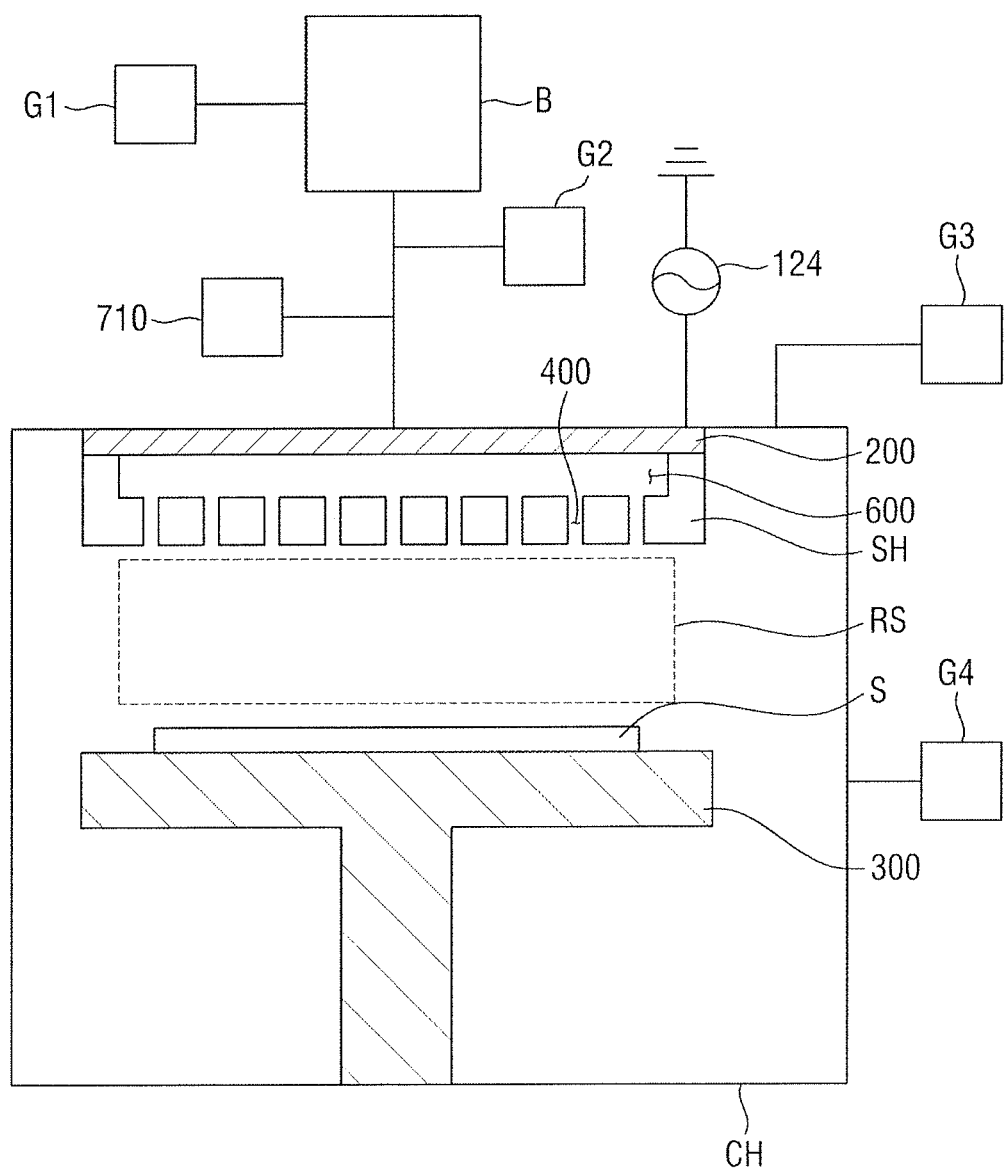
FIG. 3 illustrates a view showing a deposition apparatus according to an exemplary embodiment.

FIG. 3 illustrates a view showing a deposition apparatus according to an exemplary embodiment.

According to the embodiment illustrated in FIG. 3, a deposition apparatus may include a bubbler B. The bubbler B may replace the vaporizer V and the metal source storage SO of the exemplary embodiment shown in FIG. 1.

The bubbler B may store a metal source in the liquid phase and may transform the liquid metal source into bubbles.

The first gas source G1 may be connected to the bubbler B to provide the first gas to the bubbler B to transform the metal source into bubbles.

The first gas may be an inert gas. The inert gas may include, for example, helium (He) or argon (Ar).

The bubbler B may be connected to the chamber CH. The bubbler B may be connected to the chamber CH via at least one channel. For example, the metal source in the form of bubbles generated in the bubbler B may be supplied to the chamber CH through the channel. For example, the metal source in the form of bubbles may be supplied into the gas inlet space 600 in the chamber CH. The metal source supplied into the gas inlet space 600 may be provided into the reaction space RS through the plurality of shower holes 400.

The second gas source G2 may be connected to the channel connecting the bubbler B with the chamber CH to supply the second gas.

The second gas may serve to adjust the concentration of the metal source provided from the bubbler B to the chamber CH. The second gas may include helium (He) or argon (Ar) gas. In some implementations, the second gas source G2 may be omitted.

The deposition apparatus may further include a fifth gas source 710. The fifth gas may be used to remove the metal source remaining in the channel connecting the bubbler B with the chamber CH.

The bubbler B may be an expendable part that is discardable and replaceable with a new part.

The fifth gas source 710 may remove any metal source remaining in the channel connecting the bubbler B with the chamber CH when the bubbler B is replaced.

The fifth gas may be an octane gas. In some implementations, the fifth gas source 710 may be omitted.

As described above, by having the bubbler B instead of the metal source storage SO and the vaporizer V, energy and time required for vaporizing the metal source may be saved and productivity per hour may be improved.

The third gas source G3 and the fourth gas source G4 may be connected to the chamber CH. The third gas source G3 and the fourth gas source G4 may be connected to the chamber CH in substantially the same manner as that described above with reference to FIG. 1.

For example, the third gas source G3 may supply the third gas into the reaction space RS in the chamber CH, and the fourth gas source G4 may supply the fourth gas into the reaction space RS in the chamber CH. The reaction and the products therefrom are substantially identical to those described above with reference to FIG. 1, and therefore, redundant description thereof will not be repeated.

Figure 4:
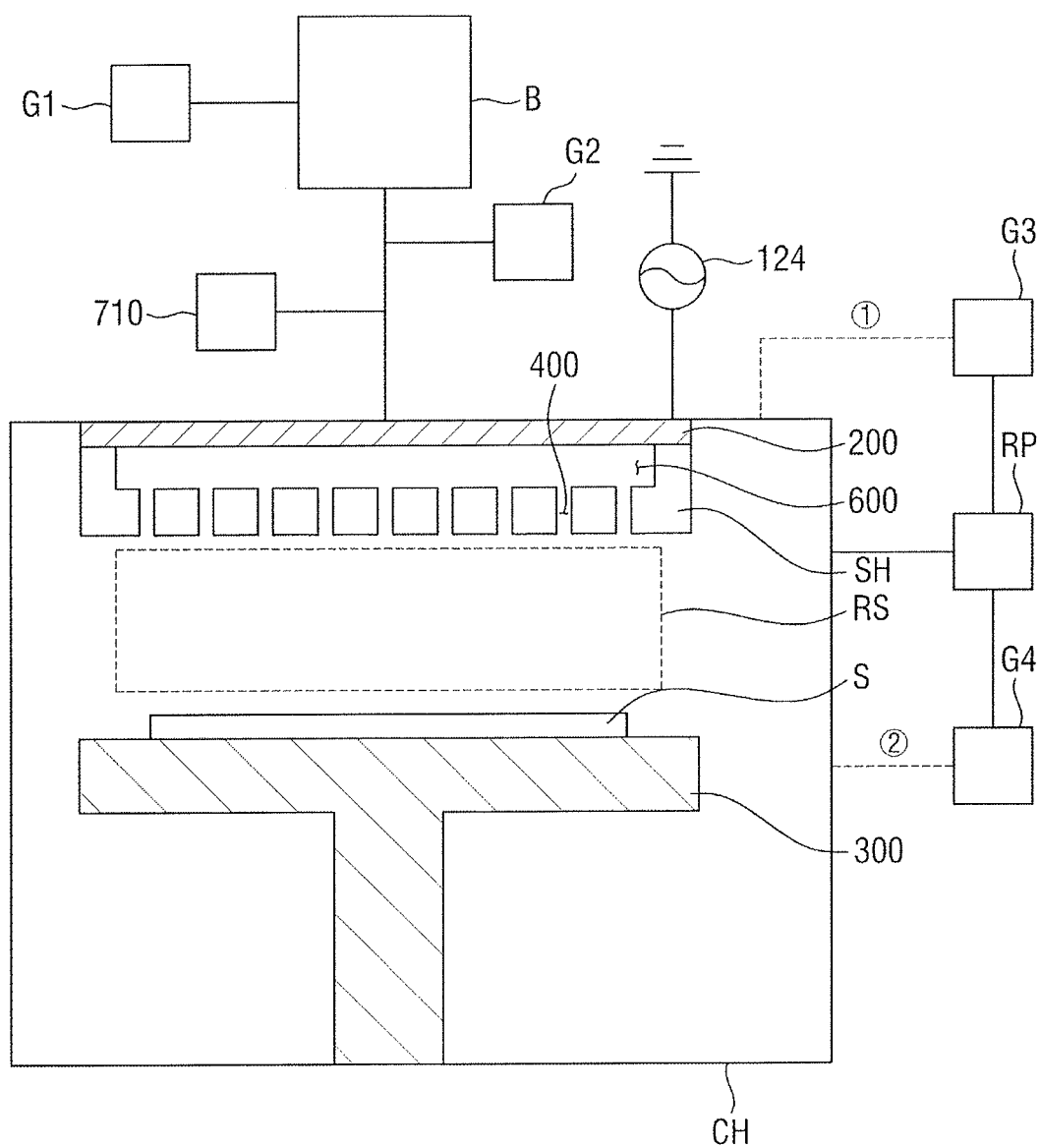
FIG. 4 illustrates a view showing a deposition apparatus according to an exemplary embodiment.

FIG. 4 illustrates a view showing a deposition apparatus according to an exemplary embodiment.

The deposition apparatus shown in FIG. 4 may further include a plasma chamber RP connected to the chamber CH, compared to the deposition apparatus shown in FIG. 3.

The third gas source G3 and the fourth gas source G4 may be connected to the plasma chamber RP in substantially the same manner as that described above with reference to FIG. 2.

For example, the third gas and/or the fourth gas may be transformed into the plasma state in the plasma chamber RP and then may be supplied into the chamber CH. The third gas source G3 and/or the fourth gas source G4 may be directly connected to the chamber CH to supply the gases into the reaction space RS of the chamber CH or may supply the gases into the chamber CH via the plasma chamber RP.

As such, by supplying the third gas and/or the fourth gas into the chamber CH after they have been transformed into the plasma state in a separate space, the materials required for the reaction can be provided in the appropriate states, thereby improving the reaction efficiency.

Figure 5:
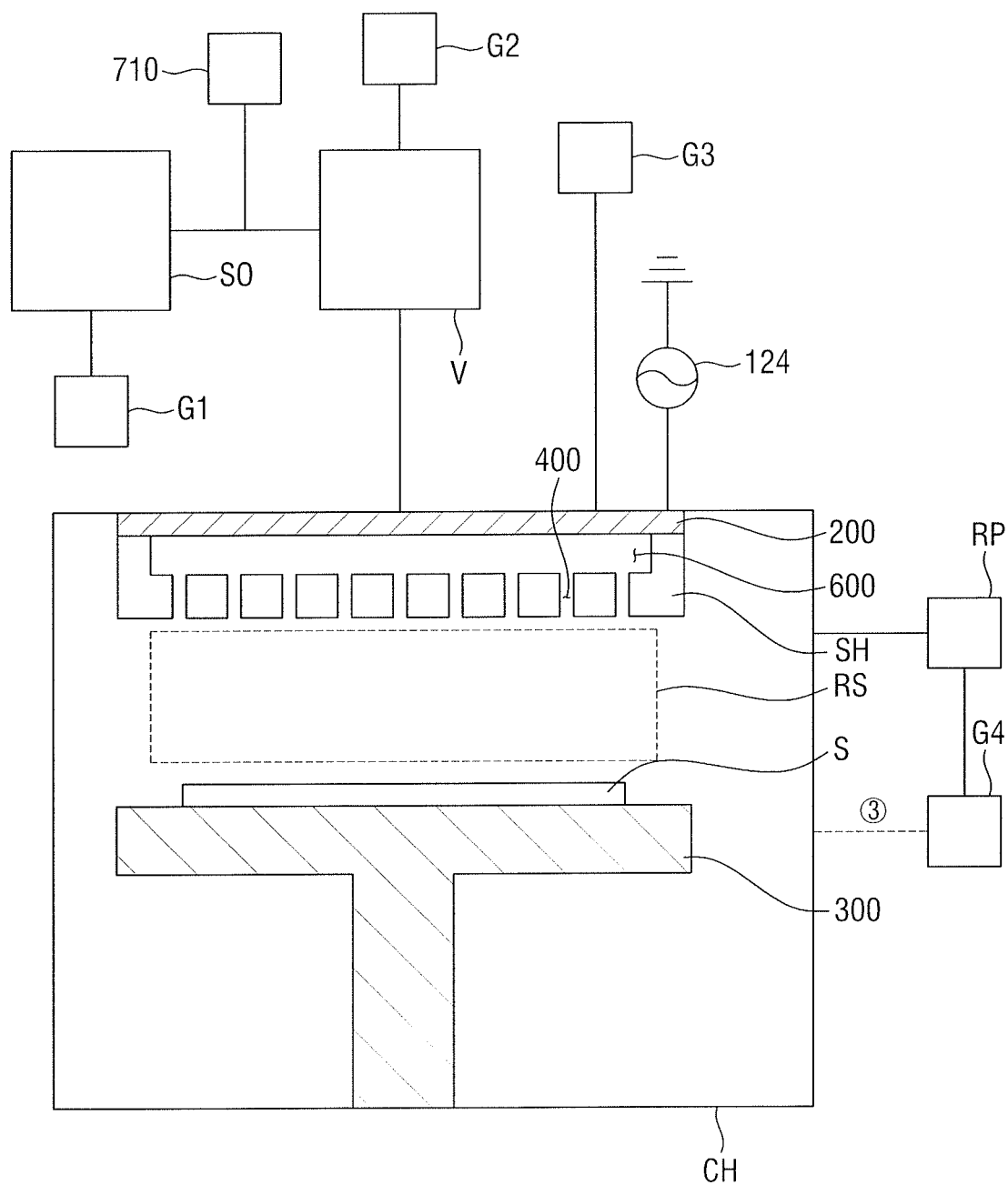
FIG. 5 illustrates a view showing a deposition apparatus according to an exemplary embodiment.

FIG. 5 illustrates a view showing a deposition apparatus according to an exemplary embodiment. In the embodiment illustrated in FIG. 5, the third gas source G3 may be connected to the gas inlet space 600 of the showerhead SH.

For example, the third gas source G3 may supply the third gas into the gas inlet space 600 of the showerhead SH. As described above with reference to FIGS. 1 and 3, the metal source may be supplied into the gas inlet space 600 after it has been vaporized by the vaporizer V or has been formed into bubbles by the bubbler B.

In the embodiment illustrated in FIG. 5, the third gas as well as the metal source may be present in the gas inlet space 600. The third gas may not yet be in the form of a plasma and thus, the third gas and the metal source may not react with each other.

The metal source and the third gas in the gas inlet space 600 may be supplied into the reaction space RS through the plurality of shower holes 400. When a plasma region is formed in the reaction space RS, the third gas may be transformed into a plasma state. The reaction after the third gas is transformed into the plasma state may be the same as that of the above-described exemplary embodiments; and, therefore, redundant description thereof will not be repeated.

In the embodiment illustrated in FIG. 5, the fourth gas source G4 may be directly connected to the chamber CH as indicated by dotted line ③ in FIG. 5 or may be connected to the chamber CH via the plasma chamber RP. When the fourth gas source G4 is directly connected to the chamber CH, the fourth gas may be used to remove residual layers adsorbed on the inner wall of the chamber CH or the showerhead SH after the fourth gas has been transformed into the plasma state in the reaction space RS.

When the fourth gas source G4 is directly connected to the chamber CH via the plasma chamber RP, the fourth gas may be used to remove residual layers adsorbed on the inner wall of the chamber CH or the showerhead SH after the fourth gas has been transformed into the plasma state in the plasma chamber RP.

Figure 6:
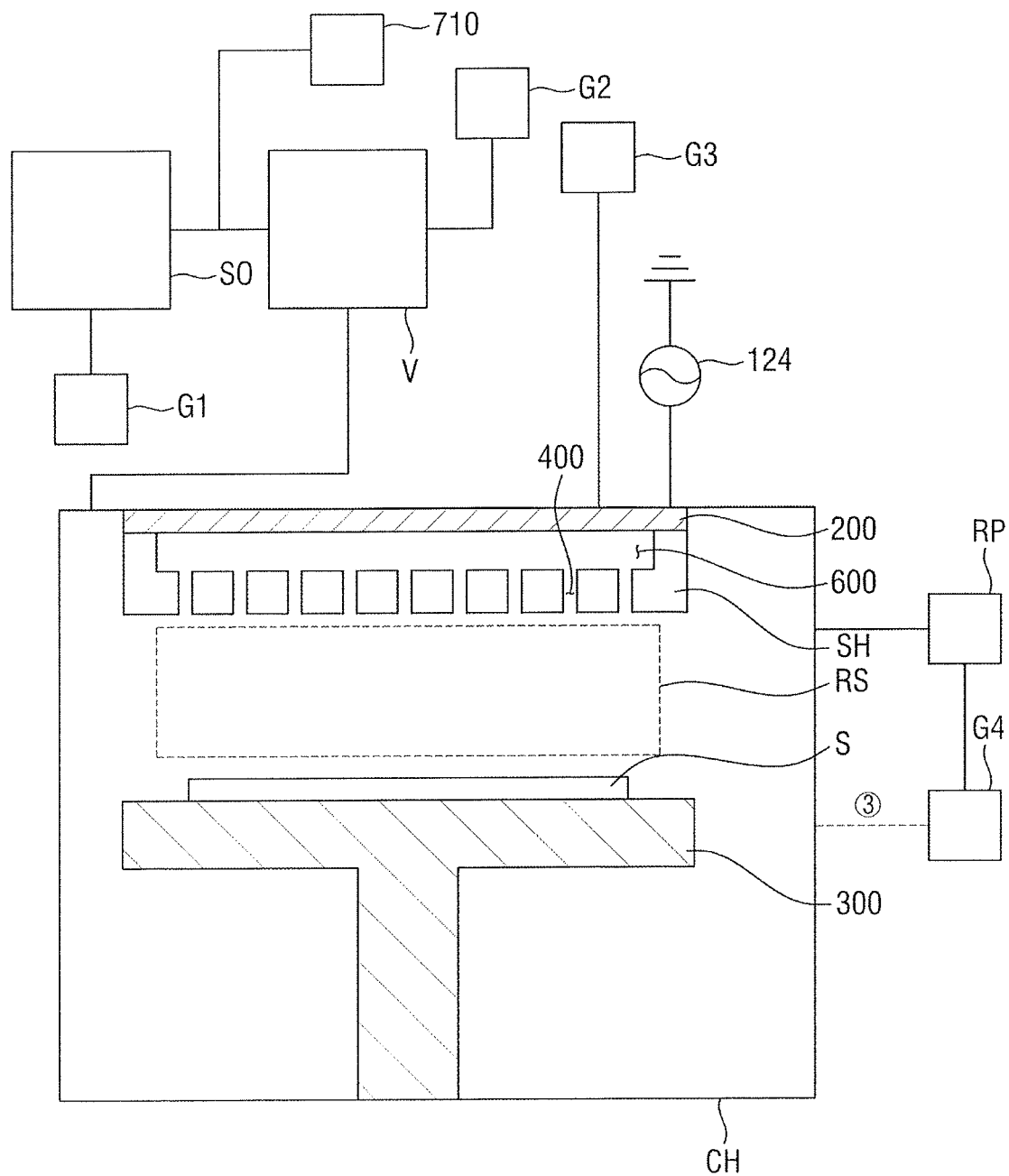
FIG. 6 illustrates a view showing a deposition apparatus according to an exemplary embodiment.

FIG. 6 illustrates a view showing a deposition apparatus according to an exemplary embodiment.

According to the exemplary embodiment shown in FIG. 6, the metal source supplied via the vaporizer V or the bubbler B may be directly supplied into the reaction space RS of the chamber CH without passing through the gas inlet space 600. The third gas source G3 may be supplied into the gas inlet space 600 of the showerhead SH. Accordingly, the third gas and the metal source may not meet each other until they arrive at the reaction space RS. When the metal source and the third gas enter the reaction space RS via different routes, it may be possible to prevent the metal source and the third gas from reacting with each other before reaching the reaction space, which could result in defective deposition, or a lowering the reaction efficiency in the reaction space RS.

Figure 7:
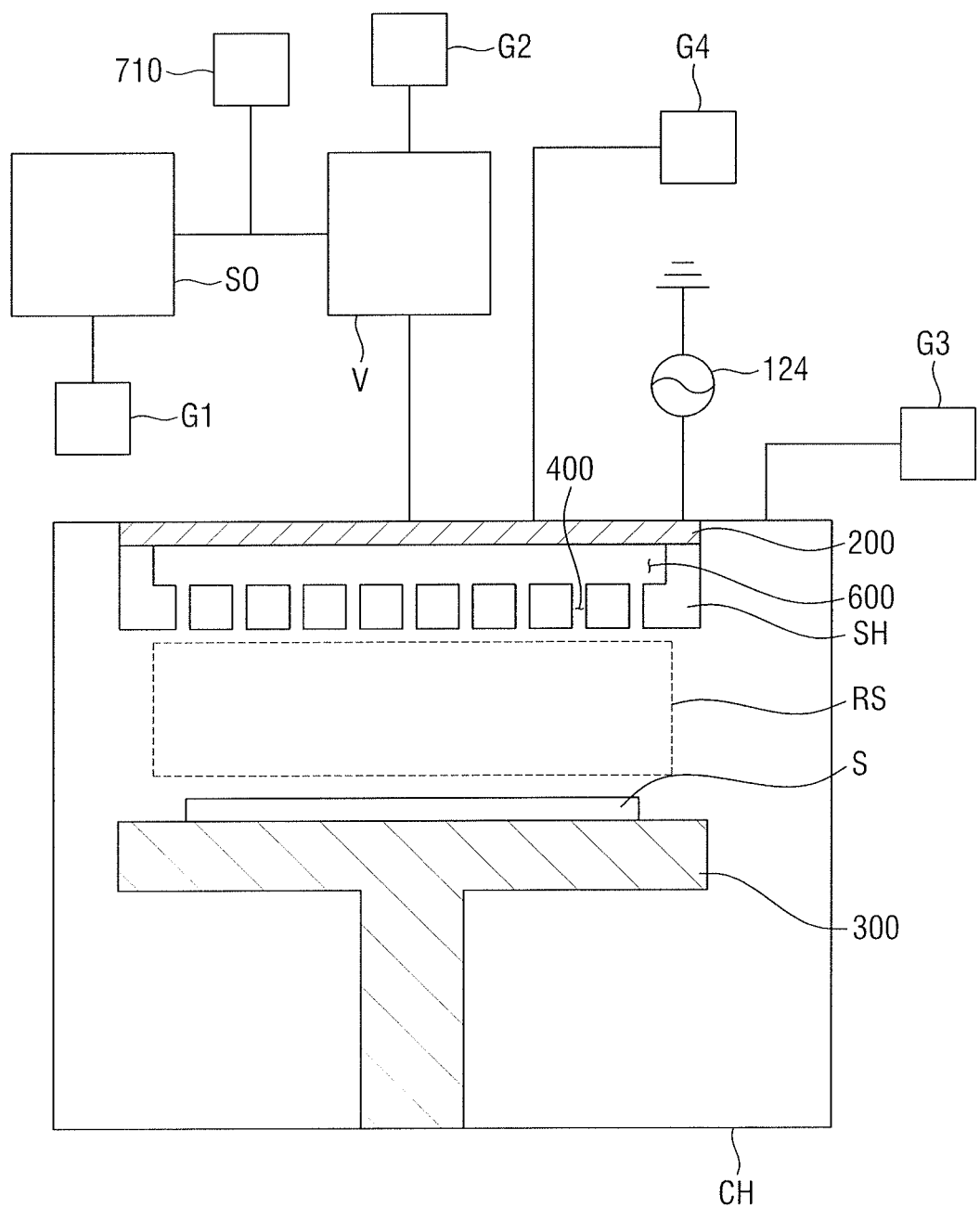
FIG. 7 illustrates a view showing a deposition apparatus according to any exemplary embodiment.

FIG. 7 is a view showing a deposition apparatus according to an exemplary embodiment.

In the embodiment illustrated in FIG. 7, The fourth gas source G4 may be connected to the showerhead SH. For example, the fourth gas source G4 may be connected to the gas inlet space 600 of the showerhead SH. The fourth gas source G4 may be directly connected to the gas inlet space 600 through at least one channel and may supply the fourth gas to the gas inlet space 600 of the showerhead SH.

According to embodiment illustrated in FIG. 7, the fourth gas may be supplied into the gas inlet space 600 before it is transformed into the plasma state.

The fourth gas may be supplied into the reaction space RS through the plurality of shower holes 400.

When a plasma region is formed in the reaction space RS, the fourth gas may be transformed into the plasma state. The reaction after the fourth gas has been transformed into the plasma state may be the same as that of the above-described exemplary embodiments; and, therefore, redundant description thereof will not be repeated.

Figure 8:
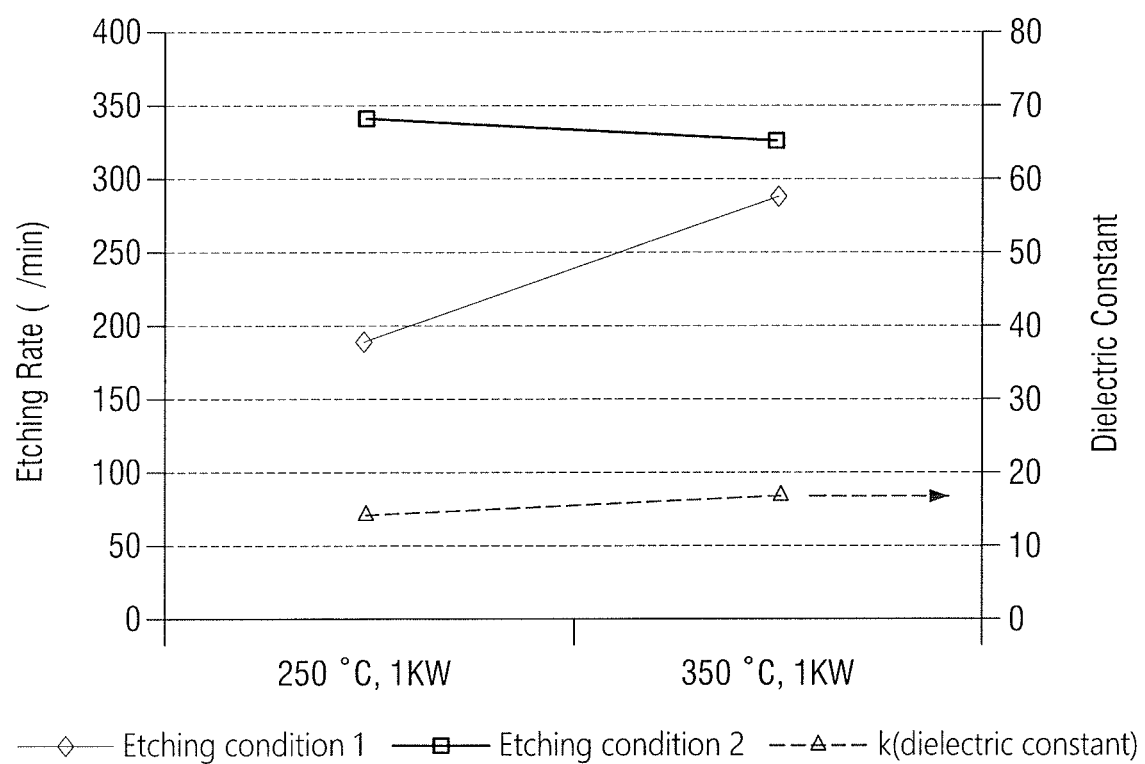
FIG. 8 illustrates a graph showing the efficiency of a deposition apparatus according to exemplary embodiments.
Figure 9:
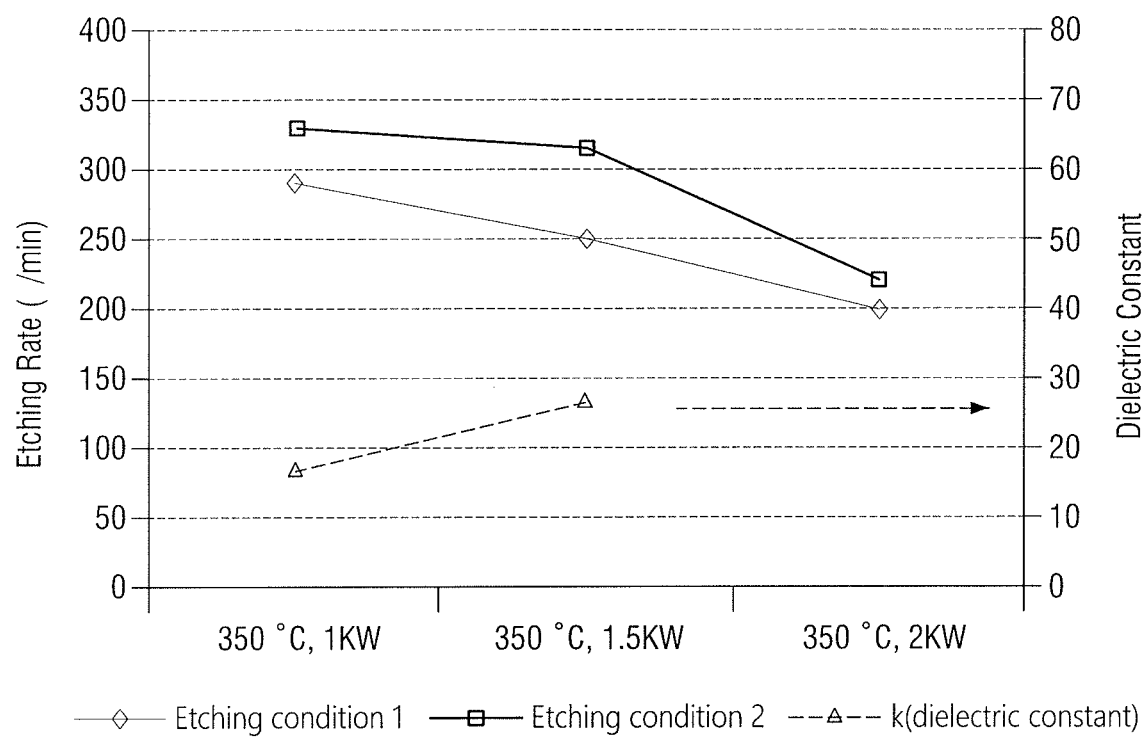
FIG. 9 illustrates a graph showing the efficiency of a deposition apparatus according to exemplary embodiments.

FIGS. 8 and 9 are graphs showing the efficiency of deposition apparatuses according to some exemplary embodiments.

FIGS. 8 and 9 are experimental data obtained when zirconium (Zr) was used as the metal source, and boron trichloride ($BCl_3$) was used as the fourth gas. As described above, the fourth gas may be used to remove a residual layer by etching. In the graphs shown in FIGS. 8 and 9, Etching Conditions 1 and 2 are identical to each other except for the density of layers to be deposited.

In addition, the temperatures shown in FIGS. 8 and 9 represent process temperatures, and KW represents the supplied power.

In addition, the etching rate on the vertical axis represents the rate at which the residual layer is removed.

Referring to FIGS. 8 and 9, it can be seen that the dielectric constant k of the deposited layer is equal to greater than 10. This shows that a metal oxide layer having a high dielectric constant is formed by a CVD method.

Further, as described above, by supplying the fourth gas into the chamber CH, it is possible to remove the residual layer. It can be seen from the graphs that the etching rate is above 150 Å/min under any of the conditions. As long as the etching rate of the residual layer is above 150 Å/min, the break time of the process can be shortened, and thus the process can be continuously carried out, and the process efficiency can be improved.

Hereinafter, a deposition method according to an exemplary embodiment will be described. Some of elements described below may be identical to those of the deposition apparatus according to the above-described exemplary embodiment; and, therefore, description thereof may be omitted to avoid redundancy.

A deposition method according to an exemplary embodiment includes supplying a vaporized metal source or a metal source in the form of bubbles into a chamber CH, supplying a reaction gas into the chamber CH, transforming the reaction gas into a plasma state, supplying a cleaning gas into the chamber, and transforming the cleaning gas into a plasma state.

The deposition method according to the exemplary embodiment may be carried out by using the deposition apparatus according to any of the above-described embodiments.

The method may include supplying a vaporized metal source or a metal source in the form of bubbles into the chamber CH. The chamber CH and the metal source may be substantially identical to the chamber CH and the metal source of the deposition apparatus described above.

The metal source may be vaporized by the vaporizer V as described above with reference to FIG. 1 or may be transformed into bubbles by the bubbler B as described above with reference to FIG. 3.

The vaporized metal source or the metal source in the form of bubbles may be supplied into the chamber CH. According to an embodiment, the metal source may be supplied into the reaction space RS in the chamber CH via the gas inlet space 600 of the showerhead SH (see FIG. 1 or the like) or may be supplied directly into the reaction space RS without passing through the showerhead SH (see FIG. 6 or the like).

Subsequently, the method may include supplying a reaction gas into the chamber CH, and transforming the reaction gas into a plasma state.

The reaction gas may be the third gas described above with reference to FIG. 1 or the like. For example, the reaction gas may be nitrous oxide ($N_2O$) and/or oxygen ($O_2$). As described above, nitrous oxide ($N_2O$) and/or oxygen ($O_2$) may be used to generate oxygen anions in the plasma state. The generated oxygen anions may react with the metal source to form a metal oxide layer. The products of the reaction may be identical to those of the deposition apparatuses according to the above-described embodiments.

Supplying the reaction gas into the chamber CH and transforming the reaction gas into the plasma state may be carried out simultaneously, sequentially, or in the reverse order. For example, the reaction gas may be transformed into the plasma state as soon as the reaction gas is supplied into the reaction space RS of the chamber CH. In some implementations, the reaction gas may become the plasma state after the reaction gas is supplied into the reaction space RS of the chamber CH and a plasma region is formed. In some implementations, the reaction gas may be transformed into the plasma state in a separate chamber such as the plasma chamber RP of FIG. 4 and may be supplied into the reaction space RS of the chamber CH in the plasma state.

The reaction gas may be supplied directly into the reaction space RS of the chamber CH (see FIG. 1), may be supplied via the showerhead SH (see FIG. 5), or may be supplied into the reaction space RS of the chamber CH via the plasma chamber RP disposed outside the chamber CH (see FIG. 5).

The reaction gas in the plasma state may be combined with the metal source to form a metal oxide layer. For example, the metal oxide layer may be formed on a substrate S placed on the susceptor 300. For example, the deposition method according to an embodiment may further include forming a metal oxide layer on a substrate S, and removing the substrate having the metal oxide layer formed thereon from the chamber CH.

As described above, the metal oxide layer may also be formed on the inner wall of the chamber CH or the showerhead SH, as well as on the substrate S. As mentioned earlier, such a metal oxide layer is referred to as a residual layer.

To remove such a residual layer, the method may include supplying a cleaning gas into the chamber CH, and transforming the cleaning gas into a plasma state. The cleaning gas may be the fourth gas of the deposition apparatus described above.

The process of removing the residual layer with the cleaning gas may be substantially identical to that of the deposition apparatuses according to some exemplary embodiments.

When the cleaning gas include boron trichloride ($BCl_3$) and/or chlorine molecule ($Cl_2$), chlorine anions or chlorine radicals may be provided in the plasma state. When the cleaning gas is nitrogen trifluoride ($NF_3$), fluorine anions or fluorine radicals may be provided in the plasma state.

The generated chlorine anions or chlorine radicals may react with the residual layer, which is a metal oxide layer. In an exemplary embodiment, if the residual layer is composed of zirconium oxide (ZrOx), the residual layer may react with chlorine anions or chlorine radicals to result in gaseous zirconium chloride (ZrCl) and oxygen. Zirconium chloride (ZrCl) and oxygen are both gases, the residual layer adsorbed on the inner wall of the chamber CH can be all vaporized and removed. The same applies when the residual layer is composed of hafnium or titanium. If the residual layer is composed of hafnium oxide (HfOx), the residual layer may react with chlorine anions or chlorine radicals to generate gaseous hafnium chloride (HFCl) and oxygen.

If the residual layer is composed of titanium oxide (TiOx), the residual layer may react with chlorine anions or chlorine radicals to generate gaseous titanium chloride (TiCl) and oxygen.

Similarly, the generated fluorine anion or fluorine radical may react with the metal oxide layer. The products of the reaction between the residual layer and the fluorine anion or the fluorine radical, such as ZrF, HlF and TiF, are all gaseous. Accordingly, the residual layer can be vaporized and removed.

As described above, by removing the residual layer inside the chamber CH with the cleaning gas, it is possible to skip an operation of stopping the facility to remove the residual layer and an operation of cleaning the inside of the chamber CH in the facility. In this manner, a break time of the process can be reduced and the process efficiency can be improved.

Supplying the cleaning gas and the transforming the cleaning gas into the plasma state may be carried out simultaneously, sequentially, or in the reverse order.

For example, the cleaning gas may be transformed into the plasma as soon as the cleaning gas is supplied into the reaction space RS of the chamber CH. In some implementations, the cleaning gas may be transformed into the plasma after it is supplied into the reaction space RS of the chamber CH and then a plasma region is formed therein (see FIG. 1). In some implementations, the cleaning gas may be transformed into a plasma in a separate chamber such as the plasma chamber RP of FIG. 4, then to be supplied into the chamber CH.

In some implementations, the cleaning gas may be supplied directly into the chamber CH as shown in FIG. 1, or may be supplied into the chamber CH via the separate plasma chamber RP as shown in FIG. 2.

By way of summation and review, methods for fabricating display devices may include chemical vapor deposition (CVD).

Embodiments provide a deposition apparatus and a deposition method for producing a metal oxide layer having a high dielectric constant using chemical vapor deposition (CVD).

Embodiments also provide a deposition apparatus and a deposition method for improving the efficiency of the process.

The efficiency of the deposition method may be improved by removing a residual layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A deposition apparatus, comprising:
a chamber;
a susceptor that supports a substrate in the chamber;
an upper electrode facing the susceptor;
a power supplier to supply a radio frequency (RF) power to the upper electrode such that a plasma region is formed in a reaction space defined between the susceptor and the upper electrode when the RF power is supplied to the upper electrode;
a showerhead defining a gas inlet space between the upper electrode and the susceptor;
a metal source storage to store a metal source supplied to the chamber;
a vaporizer to vaporize the metal source;
a first gas source connected to the metal source storage to supply a first gas used to move the metal source toward the vaporizer;
a second gas source connected to the vaporizer to supply a second gas used to move the metal source in the vaporizer toward the chamber;
a third gas source connected to the chamber to supply a third gas into the reaction space such that the third gas is transformed into a plasma state and reacts with the metal source; and
a fourth gas source connected to the chamber to supply a fourth gas used to react with and remove a residual metal oxide layer absorbed in an inner wall of the chamber.

2. The apparatus as claimed in claim 1, wherein the fourth gas includes one selected from boron trichloride ($BCl_3$), molecular chlorine ($Cl_2$), and nitrogen trifluoride ($NF_3$).

3. The apparatus as claimed in claim 1, wherein the third gas is nitrous oxide ($N_2O$) or oxygen ($O_2$) and generates oxygen anions in the plasma region.

4. The apparatus as claimed in claim 1, wherein the metal source and the reaction gas react with each other to form a metal oxide layer in the chamber.

5. The apparatus as claimed in claim 4, wherein the metal oxide layer is in an amorphous state, and the metal oxide layer has a dielectric constant ranging from 10 to 50.

6. The apparatus as claimed in claim 4, wherein the fourth gas removes a part of the metal oxide layer formed on an inner wall of the chamber or the showerhead.

7. The apparatus as claimed in claim 1, wherein the metal source includes at least one metal precursor selected from a zirconium (Zr) precursor, a hafnium (HF) precursor, and a titanium (Ti) precursor.

8. The apparatus as claimed in claim 7, wherein the metal precursor is selected from $Zr(N(CH_3)_2(C_2H_5))_3$, $Zr(N(CH_3)C_2H_5)_4$, $Zr(OC(CH_3)_3)_4$, $Ti(N(CH_3)_2(C_2H_5))$, $Hf(N(CH_3)_3(C_2H_5))_3$, $Hf(N(CH_3)C_2H_5))_4$ and $Hf(OC(CH_3)_3)_4$.

9. The apparatus as claimed in claim 1, wherein the first gas and the second gas include helium or argon.

10. The apparatus as claimed in claim 1, wherein the metal source is supplied into the reaction space via the gas inlet space.

11. The apparatus as claimed in claim 10, wherein the third gas is supplied into the reaction space without passing through the gas inlet space.

12. The apparatus as claimed in claim 10, wherein the third gas is supplied into the reaction space via the gas inlet space.

13. The apparatus as claimed in claim 1, wherein the fourth gas is supplied into the reaction space via the gas inlet space.

14. A deposition apparatus, comprising:
a chamber;
a susceptor that supports a substrate in the chamber;
a showerhead defining a gas inlet space;
a metal source storage to store a metal source supplied to the chamber;
a vaporizer to vaporize the metal source;
a first gas source connected to the metal source storage to supply a first gas used to move the metal source toward the vaporizer;
a second gas source connected to the vaporizer to supply a second gas used to move the metal source in the vaporizer toward the chamber;
a third gas source connected to the chamber to supply a third gas into a reaction space defined between the susceptor and the upper electrode such that the third gas reacts with the metal source;
a fourth gas source connected to the chamber to supply a fourth gas used to react with and remove a residual metal oxide layer absorbed in an inner wall of the chamber; and
a plasma chamber outside the chamber, the plasma chamber being configured to transform the third gas or the fourth gas into a plasma state.

15. The apparatus as claimed in claim 14, wherein the third gas or the fourth gas is supplied into the reaction space of the chamber via the plasma chamber.

16. The apparatus as claimed in claim 14, wherein the third gas and the fourth gas are supplied into the reaction space of the chamber via the plasma chamber.

17. A deposition apparatus, comprising:
a chamber;
a susceptor in the chamber and the susceptor being configured to support a substrate;
a showerhead defining a gas inlet space;
a bubbler that stores a metal source supplied into the chamber;
a first gas source connected to the bubbler to supply a first gas used to transform the metal source into bubbles;

a reaction gas source connected to the chamber to supply a reaction gas into a reaction space defined between the susceptor and the upper electrode so that the reaction gas reacts with the metal source; and a cleaning gas source connected to the chamber to supply a cleaning gas in plasma form used to react with and remove a residual metal oxide layer absorbed in an inner wall of the chamber.

18. The apparatus as claimed in claim 17, wherein the cleaning gas includes one selected from boron trichloride ($BCl_3$), molecular chlorine ($Cl_2$), and nitrogen trifluoride ($NF_3$).

19. The apparatus as claimed in claim 17, wherein the reaction gas is nitrous oxide ($N_2O$) or oxygen ($O_2$).

20. The apparatus as claimed in claim 17, wherein the metal source includes at least one metal precursor selected from zirconium (Zr) precursor, hafnium (HF) precursor, and titanium (Ti) precursor.

* * * * *